United States Patent [19]
Onodera

[11] Patent Number: 5,543,754
[45] Date of Patent: Aug. 6, 1996

[54] CAPACITOR AND RESISTOR CONTROLLED OSCILLATOR TIMING LOCK LOOP FOR PRECISION TIME CONSTANTS

[75] Inventor: Keith K. Onodera, Berkeley, Calif.

[73] Assignee: National Semiconductor Corporation, Santa Clara, Calif.

[21] Appl. No.: 321,242

[22] Filed: Oct. 11, 1994

[51] Int. Cl.$^6$ ............................................. H03L 7/099
[52] U.S. Cl. ............................ 331/25; 331/34; 331/179
[58] Field of Search ................................. 331/34, 25, 179

[56] References Cited

U.S. PATENT DOCUMENTS

| | | | |
|---|---|---|---|
| 3,538,450 | 11/1970 | Andrea et al. | 331/179 X |
| 4,941,156 | 7/1990 | Stern et al. | 375/118 |
| 5,036,294 | 7/1991 | McCaslin | 331/17 |
| 5,053,723 | 10/1991 | Schemmel | 331/17 |

OTHER PUBLICATIONS

Yannis P. Tsividis, "Integrated Continuous–Time Filter Design–An Overview", IEEE Journal of Solid–State Circuits, vol. 29, No. 3, Mar. 1994, pp. 166–176.

*Primary Examiner*—Siegfried H. Grimm
*Attorney, Agent, or Firm*—Limbach & Limbach L.L.P.

[57] ABSTRACT

A system including a reference oscillator, a controlled oscillator, a digital phase detector, and a digital loop filter uses a method for matching a first oscillation frequency of the controlled oscillator with a second oscillation frequency of the reference oscillator by variably selecting different capacitances and/or resistances of the controlled oscillator using switches. The first and second oscillation frequencies are provided to the digital phase detector, where they are compared to determine an output signal which is indicative of the difference between the first and second frequencies. The output signal is transmitted to a digital loop filter, which converts the output signal into control words. The control words are sent to the controlled oscillator so that the first oscillation frequency can be varied as needed. The controlled oscillator may be a capacitor controlled oscillator (CCO), a resistor controlled oscillator (RCO), or a resistor-capacitor controlled oscillator (RCCO).

32 Claims, 4 Drawing Sheets

CAPACITOR AND RESISTOR CONTROLLED OSCILLATOR TIMING LOCK LOOP FOR PRECISION TIME CONSTANTS

FIELD OF THE INVENTION

The present invention relates to a capacitor controlled oscillator and a system associated therewith for generating an internal clock signal that tracks a reference clock signal.

BACKGROUND OF THE INVENTION

It is known in the prior art to use a voltage controlled oscillator (VCO) in conjunction with a phase locked loop (PLL) to synchronize an internal clock (or oscillator) with a reference clock (or oscillator). In normal phase locked loops, the oscillator frequency changes continuously with voltage. Thus, it is possible to find a voltage that results in an oscillator frequency that precisely matches the frequency of a reference oscillator.

However, in the digital domain, a precise match cannot always be obtained because of the inherent obstacles presented by using discrete elements. Therefore, the normal phase locked loop would result in having an output that jumps back and forth from frequencies that are too high to frequencies that are too low, because normally there would be no exact match.

Other methods known in the prior art include using the transconductance of a bipolar transistor. These methods usually result in current controlled oscillators that use normal phase locked loops operating in the analog domain.

Various other methods are disclosed by Yannis P. Tsividis in "Integrated Continuous-Time Filter Design—An Overview", IEEE Journal of Solid-State Devices, Vol. 29, No. 3, (March 1994).

SUMMARY OF THE INVENTION

The present invention is directed to a capacitor controlled oscillator timing lock loop system that is more reliable and easier to implement than prior art systems.

The present invention includes a reference oscillator, a capacitor controlled oscillator, a digital phase detector and a digital loop filter, and is directed to a method for matching a first oscillation frequency of the capacitor controlled oscillator with a second oscillation frequency of the reference oscillator. The first and second oscillation frequencies are provided to the digital phase detector, which compares them to determine an output signal which is indicative of the difference between the first and second frequencies. The output signal is transmitted to a digital loop filter which converts the output signal into control words. The control words are sent to the capacitor controlled oscillator so that the first oscillation frequency can be varied as needed.

The capacitor controlled oscillator of the present invention is provided with plurality of capacitors having different capacitances such that the first oscillation frequency is determined by whichever one of the plurality of capacitors is selected.

According to one specific embodiment of the present invention, the first oscillation frequency of the capacitor controlled oscillator may be varied by incrementally decreasing the capacitances until the first oscillation frequency is greater than the second oscillation frequency.

Therefore, the closest matching frequency can be discovered in a controlled and reliable fashion without having the frequency constantly changing between being greater than and slower than the reference frequency.

Other embodiments of the present invention include resistor controlled oscillators (RCOs) and resistor-capacitor controlled oscillators (RCCOs).

Other objects, features and advantages of the present invention will become apparent in view of the detailed description of the preferred embodiments.

DETAILED DESCRIPTION OF THE PREFERRED EMBODIMENTS

Figure 1:
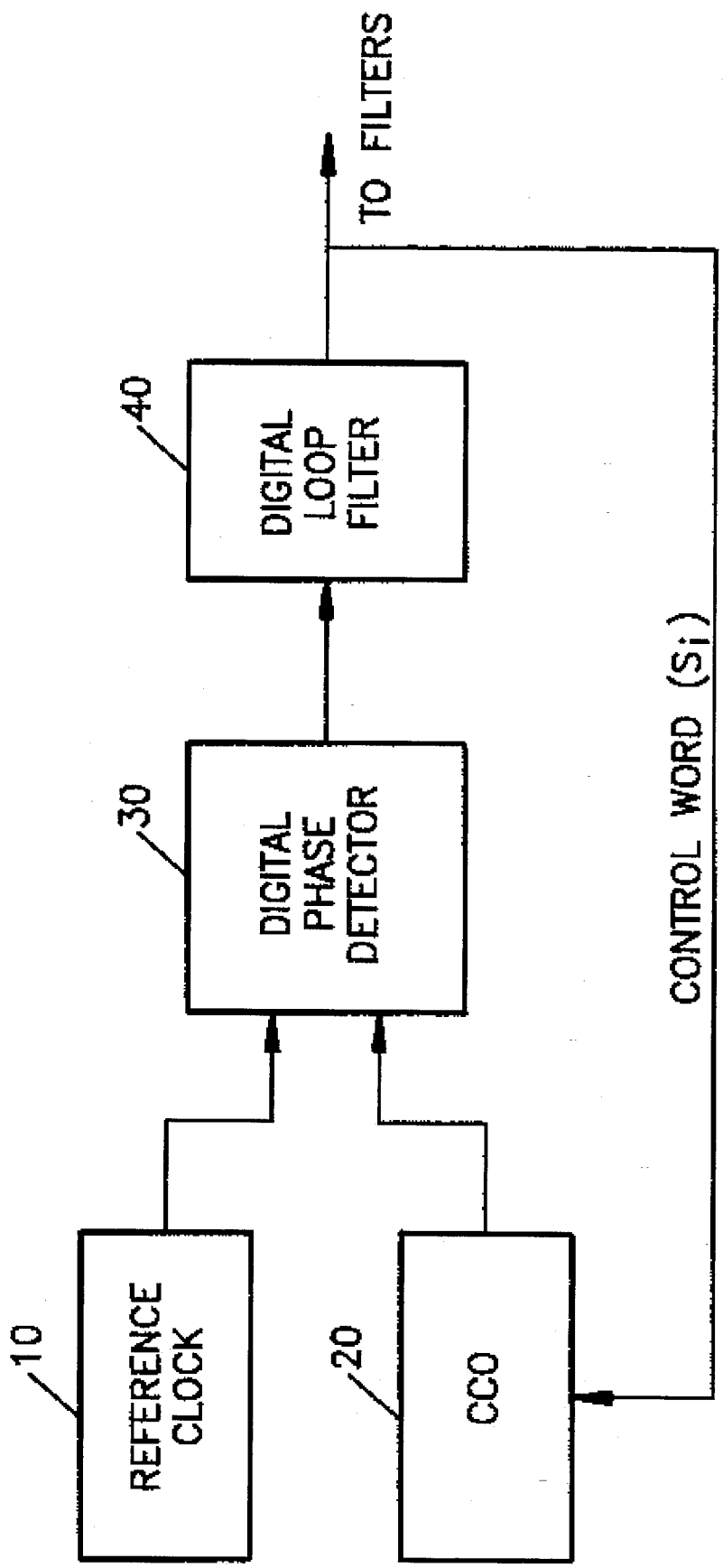
FIG. 1 illustrates a block diagram of a system incorporating a capacitor controlled oscillator according to a preferred embodiment of the present invention.

An example of a system incorporating a controlled oscillator according to a preferred embodiment of the present invention is shown in FIG. 1. The controlled oscillator shown in FIG. 1 is a capacitor controlled oscillator (CCO) 20. However, as will be discussed in more detail herein, the controlled oscillator may also be a resistor controlled oscillator (RCO) or a resistor-capacitor controlled oscillator (RCCO) or some variation thereof.

As shown in FIG. 1, a reference clock (or reference oscillator) 10 outputs a clock signal with a predetermined frequency. The capacitor controlled oscillator 20 also outputs a signal of a particular frequency. Both of these signals are input into a digital phase (or frequency) detector 30. Digital phase detector 30 compares the two signals and outputs a signal indicative of the differences in frequency between the two. This signal is passed through a digital loop filter 40 (eg. a low pass filter) which produces control words ($S_i$) which control CCO 20. As shown in FIG. 1, the control words ($S_i$) are also output from the loop. (See FIG. 1 at "To filters".)

The operation of the present invention, according to a preferred embodiment, will now be described. If reference clock 10 has a frequency which is greater than that of CCO 20, the digital phase detector outputs a signal which is sent to the CCO 20 (via the digital loop filter 40) to incrementally increase its frequency for the next comparison. This process is repeated until the frequency of CCO 20 exceeds that of reference clock 10. Once reference clock 10 has a frequency that is less than that of CCO 20, no signal is sent to CCO 20.

In order for this scheme to work properly, it is necessary that the CCO 20 begins with a starting frequency that is less than what any reference frequency would be. This way, there is no chance that the reference clock frequency will not be greater than the frequency of CCO 20 from the first comparison. Of course, it is possible to reverse this comparison scheme by starting with a very high CCO frequency and then incrementally lowering the frequency.

By stopping the frequency variations once one frequency is greater than another, a fixed, stable frequency can be produced. Therefore, the situation where one frequency oscillates above and below a reference frequency is avoided.

Figure 2:
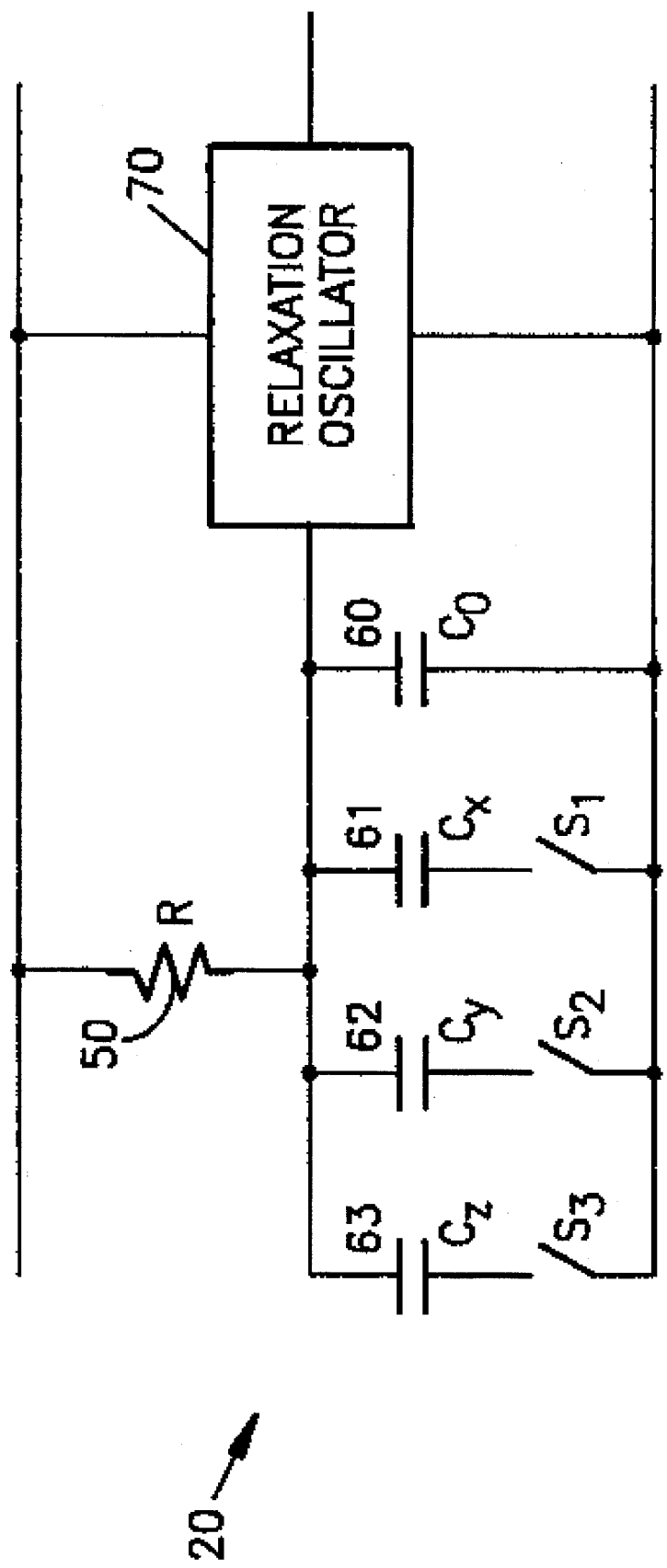
FIG. 2 illustrates a more detailed diagram of the capacitor controlled oscillator of FIG. 1 using variable capacitances.

FIG. 2 illustrates the CCO 20 of FIG. 1 in more detail. As shown in FIG. 2, a plurality of capacitors 60–63 are shown connected in parallel. Switches S1–S3 are connected in series with each of the capacitors 61–63, respectively. A resistor 50 is shown connected in series with capacitors 60–63. The combination of resistor 50 with capacitors 60–63 produces specific RC time constants which determine the frequency output by CCO 20. The relaxation oscillator 70 provides the necessary voltages and currents to convert the resistance/capacitance combination into a specific frequency.

The actual capacitance values of the capacitors are preferably binarily weighted. This will produce the largest possible range of capacitance values for a given control word size and capacitance resolution. The use of a single resistor, four capacitors and three switches is shown by way of example. Clearly, any number of resistors, capacitors and switches may be used to satisfy the needs of each individual system.

Figure 3:
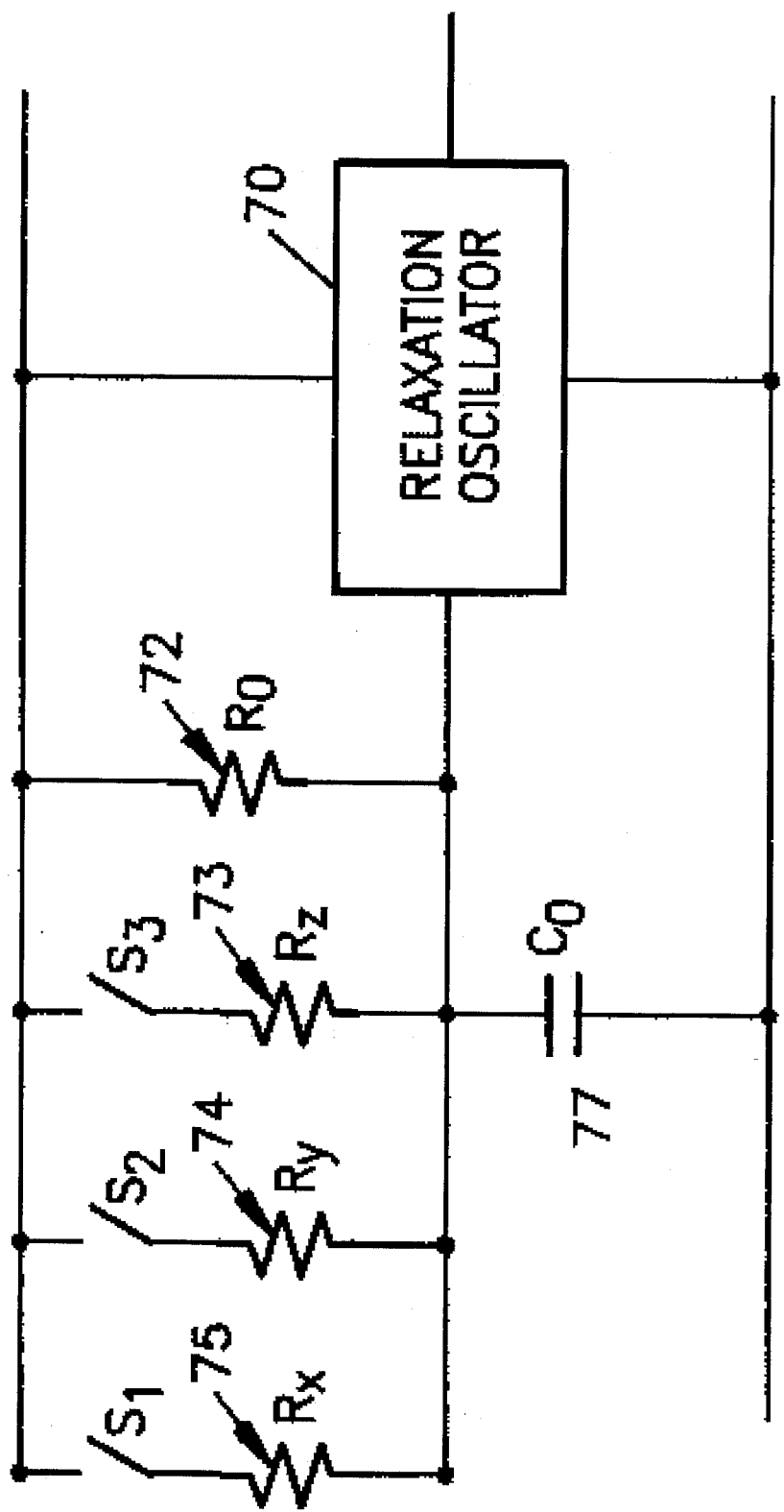
FIG. 3 illustrates a more detailed diagram of the resistor controlled oscillator of FIG. 1 using variable resistances.

Another embodiment of the present invention is shown in FIG. 3. According to this embodiment, an RCO is used in place of CCO 20 and the resistance values are varied instead of the capacitance values. Specifically, resistors 72–75 are connected in parallel. Switches S1, S2 and S3 operate resistors 75, 74 and 73, respectively, to vary the overall resistance of the RCO. Resistors 72–75 are connected in series with capacitor 77. Relaxation oscillator 70 serves the same function in each of the Figures.

Figure 4:
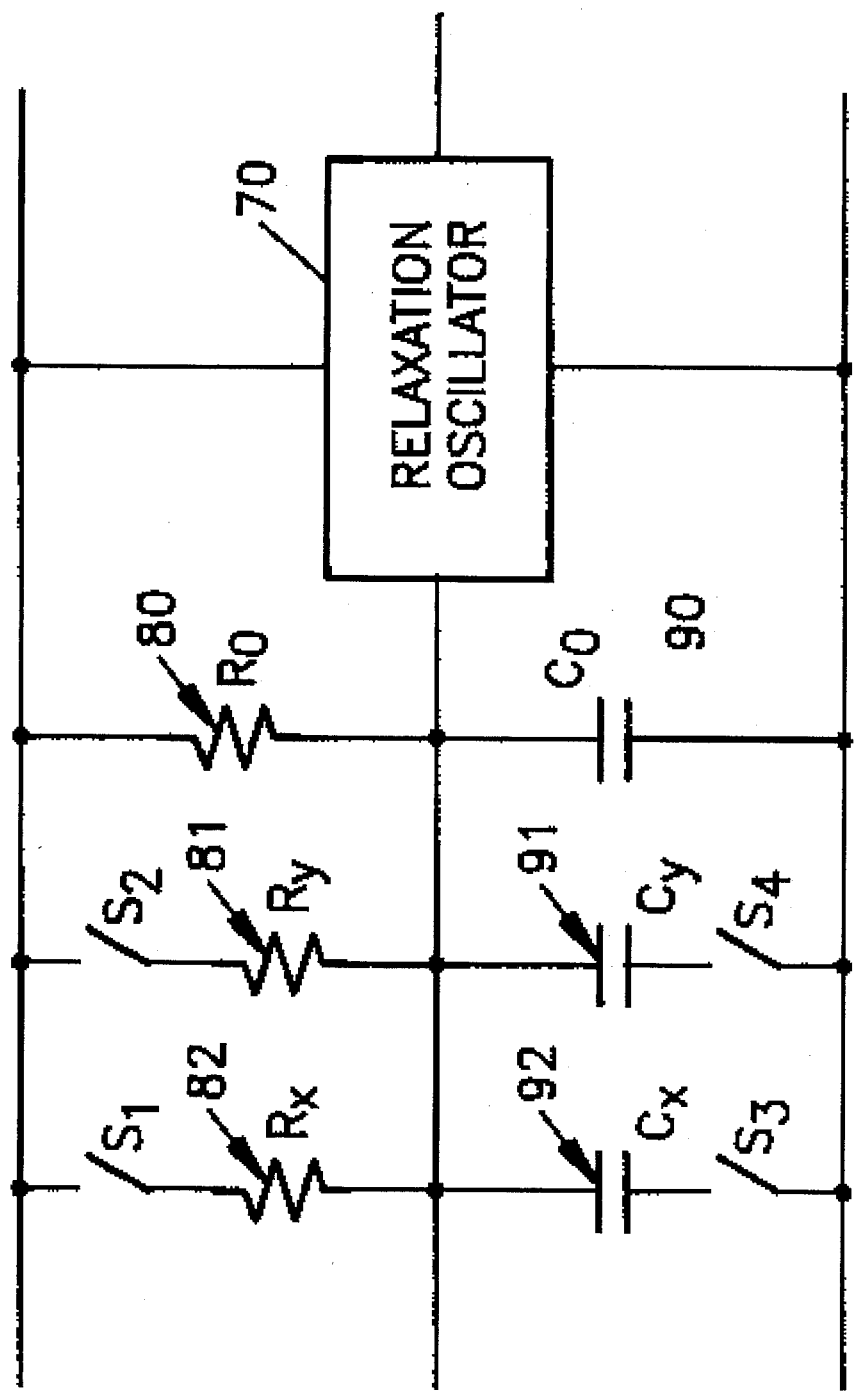
FIG. 4 illustrates a more detailed diagram of the resistor-capacitor controlled oscillator of FIG. 1 using variable resistances and capacitances.

Yet another embodiment of the present invention is shown in FIG. 4. According to this embodiment, an RCCO is used in place of CCO 20 and both the resistance and capacitance values are varied. This embodiment provides more flexibility in fine tuning, but may be more expensive than the previous two embodiments. As shown in FIG. 4, resistors 80–82 are connected in parallel with one another and in series with a parallel combination of capacitors 90–92. Switches S1 and S2 operate resistors 82 and 81, respectively, while switches S3 and S4 operate capacitors 92 and 91, respectively. It is to be understood that the number of resistors, capacitors and switches employed in each embodiment is shown by way of example only. The actual number of each of these elements may be varied depending upon the needs of the system.

Although the present invention has been disclosed with particular reference to the preferred embodiments disclosed, one of ordinary skill in the art would be enabled by this disclosure to make various modifications to this disclosure and still be within the scope and spirit of the present invention as embodied in the appended claims.

What is claimed is:

1. In a system having a reference oscillator, a controlled oscillator, a digital phase detector, and a digital loop filter, a method for approximately matching a first oscillation frequency of the controlled oscillator with a second oscillation frequency of the reference oscillator in order to generate control words corresponding to RC time constants, the method comprising the steps of:

providing the first and second oscillation frequencies to the digital phase detector;

comparing the first and second oscillation frequencies in the digital phase detector and determining an output signal which is indicative of the difference between the first and second frequencies;

transmitting the output signal to the digital loop filter, which converts the output signal into control words;

providing the control words to the controlled oscillator so that the first oscillation frequency can be varied as needed; and outputting the control words.

2. The method according to claim 1, wherein the controlled oscillator is a capacitor controlled oscillator, the capacitor controlled oscillator being provided with a plurality of capacitors having different capacitances such that the first oscillation frequency is determined by which of the plurality of capacitors is selected.

3. The method according to claim 2, wherein the first oscillation frequency of the capacitor controlled oscillator is varied by incrementally decreasing an overall capacitance until the first oscillation frequency is greater than the second oscillation frequency.

4. The method according to claim 2, wherein the plurality of capacitors have capacitances which increase incrementally by a factor of 2.

5. In a system having a reference oscillator, a controlled oscillator, a digital phase detector, and a digital loop filter, a method for approximately matching a first oscillation frequency of the controlled oscillator with a second oscillation frequency of the reference oscillator in order to generate control words corresponding to RC time constants, the method comprising the steps of:

providing the first and second oscillation frequencies to the digital phase detector;

comparing the first and second oscillation frequencies in the digital phase detector and determining an output signal which is indicative of the difference between the first and second frequencies;

transmitting the output signal to the digital loop filter, which converts the output signal into control words;

providing the control words to the controlled oscillator so that the first oscillation frequency can be varied as needed; and outputting the control words;

wherein the controlled oscillator is a resistor controlled oscillator, the resistor controlled oscillator being provided with a plurality of resistors having different resistances such that the first oscillation frequency is determined by which of the plurality of resistors is selected.

6. The method according to claim 5, wherein the first oscillation frequency of the resistor controlled oscillator is varied by incrementally decreasing an overall resistance until the first oscillation frequency is greater than the second oscillation frequency.

7. In a system having a reference oscillator, a controlled oscillator, a digital phase detector, and a digital loop filter, a method for approximately matching a first oscillation frequency of the controlled oscillator with a second oscillation frequency of the reference oscillator in order to generate control words corresponding to RC time constants, the method comprising the steps of:

providing the first and second oscillation frequencies to the digital phase detector;

comparing the first and second oscillation frequencies in the digital phase detector and determining an output signal which is indicative of the difference between the first and second frequencies;

transmitting the output signal to the digital loop filter, which converts the output signal into control words;

providing the control words to the controlled oscillator so that the first oscillation frequency can be varied as needed; and outputting the control words;

wherein the controlled oscillator is a resistor-capacitor controlled oscillator and is provided with a plurality of resistors having different resistances and a plurality of capacitors having different capacitances such that the first oscillation frequency is determined by which of the plurality of resistors and capacitors is selected.

8. A system for generating control words corresponding to RC time constants, comprising:

a controlled oscillator having a first oscillation frequency;

a reference oscillator having a second oscillation frequency;

comparing means for comparing the first and second oscillation frequencies and producing an output signal which is indicative of the difference between the first and second frequencies;

filtering means for converting the output signal into control words, wherein the control words are provided to the controlled oscillator so that the first oscillation frequency can be varied as needed; and means for outputting the control words.

9. The system according to claim 8, wherein the controlled oscillator is a capacitor controlled oscillator, the capacitor controlled oscillator being provided with a plurality of capacitors having different capacitances such that the first oscillation frequency is determined by which of the plurality of capacitors is selected.

10. The system according to claim 9, wherein the first oscillation frequency of the capacitor controlled oscillator is varied by incrementally decreasing an overall capacitance until the first oscillation frequency is greater than the second oscillation frequency.

11. The system according to claim 9, wherein the plurality of capacitors have capacitances which increase incrementally by a factor of 2.

12. A system for generating control words corresponding to RC time constants, comprising:

a controlled oscillator having a first oscillation frequency;

a reference oscillator having a second oscillation frequency;

comparing means for comparing the first and second oscillation frequencies and producing an output signal which is indicative of the difference between the first and second frequencies;

filtering means for converting the output signal into control words, wherein the control words are provided to the controlled oscillator so that the first oscillation frequency can be varied as needed; and means for outputting the control words;

wherein the controlled oscillator is a resistor controlled oscillator, the resistor controlled oscillator being provided with a plurality of resistors having different resistances such that the first oscillation frequency is determined by which of the plurality of resistors is selected.

13. The system according to claim 12, wherein the first oscillation frequency of the resistor controlled oscillator is varied by incrementally decreasing an overall resistance until the first oscillation frequency is greater than the second oscillation frequency.

14. A system for generating control words corresponding to RC time constants, comprising:

a controlled oscillator having a first oscillation frequency;

a reference oscillator having a second oscillation frequency;

comparing means for comparing the first and second oscillation frequencies and producing an output signal which is indicative of the difference between the first and second frequencies;

filtering means for converting the output signal into control words, wherein the control words are provided to the controlled oscillator so that the first oscillation frequency can be varied as needed; and means for outputting the control words;

wherein the controlled oscillator is a resistor-capacitor controlled oscillator, the resistor-capacitor controlled oscillator being provided with a plurality of resistors having different resistances and a plurality of capacitors having different capacitances such that the first oscillation frequency is determined by which of the plurality of resistors and capacitors is selected.

15. The system according to claim 8, wherein the comparing means includes a digital phase detector.

16. The system according to claim 8, wherein the filtering means includes a digital loop filter.

17. The method according to claim 1, wherein the controlled oscillator comprises a relaxation oscillator.

18. The method according to claim 1, wherein the controlled oscillator comprises:

a set of capacitors comprising at least one capacitor; and a set of resistors, connected in series with the set of capacitors, comprising at least one resistor; and wherein the frequency of the controlled oscillator is controlled by a voltage at the connection between the set of resistors and the set of capacitors.

19. The method according to claim 18, wherein the controlled oscillator further comprises a relaxation oscillator.

20. The method of claim 18, wherein the set of capacitors comprises a plurality of capacitors which are respectively selected to be connected in parallel in accordance with the control word.

21. The method of claim 18, wherein the set of resistors comprises a plurality of resistors which are respectively selected to be connected in parallel in accordance with the control word.

22. The method of claim 18, wherein:

the set of capacitors comprises a plurality of capacitors which are respectively selected to be connected in parallel in accordance with the control word; and the set of resistors comprises a plurality of resistors which are respectively selected to be connected in parallel in accordance with the control word.

23. The method of claim 1, wherein the first oscillation frequency is varied only until it exceeds the second oscillation frequency, and is not varied thereafter.

24. The method of claim 1 wherein the control words are output to a filter.

25. The system according to claim 8, wherein the controlled oscillator comprises a relaxation oscillator.

26. The system according to claim 8, wherein the controlled oscillator comprises:

a set of capacitors comprising at least one capacitor; and a set of resistors, connected in series with the set of capacitors, comprising at least one resistor; and wherein the frequency of the controlled oscillator is controlled by a voltage at the connection between the set of resistors and the set of capacitors.

27. The system according to claim 26, wherein the controlled oscillator further comprises a relaxation oscillator.

28. The system of claim 26, wherein the set of capacitors comprises a plurality of capacitors which are respectively selected to be connected in parallel in accordance with the control word.

29. The system of claim 26, wherein the set of resistors comprises a plurality of resistors which are respectively selected to be connected in parallel in accordance with the control word.

30. The system of claim 26, wherein:

the set of capacitors comprises a plurality of capacitors which are respectively selected to be connected in parallel in accordance with the control word; and the set of resistors comprises a plurality of resistors which are respectively selected to be connected in parallel in accordance with the control word.

31. The system of claim 8, wherein the first oscillation frequency is varied only until it exceeds the second oscillation frequency, and is not varied thereafter.

32. The system of claim 8, further comprising a filter which receives the control word from the means for outputting control words.

* * * * *